(12) United States Patent
Wu et al.

(10) Patent No.: US 10,651,354 B2
(45) Date of Patent: May 12, 2020

(54) OPTOELECTRONIC PACKAGE WITH A LOW WATER VAPOR TRANSMISSION RATE (WVTR) AND METHOD FOR FABRICATING THE SAME

(71) Applicant: UNISTARS CORPORATION, Zhudong Township (TW)

(72) Inventors: Shang-Yi Wu, Hsinchu (TW); Liang-Kuei Huang, Taipei (TW); Pao-Ya Wang, Taipei (TW)

(73) Assignee: UNISTARS CORPORATION, Hsinchu (TW)

( * ) Notice: Subject to any disclaimer, the term of this patent is extended or adjusted under 35 U.S.C. 154(b) by 0 days.

(21) Appl. No.: 15/616,925

(22) Filed: Jun. 8, 2017

(65) Prior Publication Data

US 2018/0212114 A1 Jul. 26, 2018

(30) Foreign Application Priority Data

Jan. 20, 2017 (TW) .............................. 106102016 A

(51) Int. Cl.
*H01L 33/56* (2010.01)
*H01L 33/58* (2010.01)
*H01L 33/00* (2010.01)

(52) U.S. Cl.
CPC .............. *H01L 33/56* (2013.01); *H01L 33/58* (2013.01); *H01L 33/0095* (2013.01); *H01L 2224/48091* (2013.01); *H01L 2224/48227* (2013.01); *H01L 2224/97* (2013.01); *H01L 2933/005* (2013.01); *H01L 2933/0058* (2013.01)

(58) Field of Classification Search
CPC ....... H01L 33/483; H01L 33/56; H01L 33/58; H01L 33/62; H01L 2224/48091; H01L 2224/48227; H01L 2224/97; H01L 2933/005; H01L 2933/0058
See application file for complete search history.

(56) References Cited

U.S. PATENT DOCUMENTS

| | | | | |
|---|---|---|---|---|
| 5,821,615 A * | 10/1998 | Lee | ...................... | H01L 23/3121 257/686 |
| 5,998,925 A * | 12/1999 | Shimizu | ............. | C09K 11/7767 257/103 |
| 6,486,499 B1* | 11/2002 | Krames | ................... | H01L 33/38 257/103 |
| 2013/0207093 A1* | 8/2013 | Jeong | .................. | H01L 51/5243 257/40 |
| 2014/0231767 A1* | 8/2014 | Tsai | ..................... | H01L 51/5246 257/40 |
| 2014/0315016 A1* | 10/2014 | Dollase | ............... | H01L 31/0481 428/339 |

(Continued)

*Primary Examiner* — Andrew Q Tran
(74) *Attorney, Agent, or Firm* — Ding Yu Tan

(57) ABSTRACT

An optoelectronic package includes a carrier, a light emitting die, a cover, and an encapsulation material. The carrier has a carrying plane and a wiring layer on the carrying plane. The light emitting die is mounted on the carrying plane and electrically connected to the wiring layer. The cover is connected to carrier. A cavity is formed between the cover and the carrier, and the light emitting die is within the cavity. The encapsulation material formed on the carrier surrounds the cover. The encapsulation material completely covers the interface between the cover and carrier.

14 Claims, 7 Drawing Sheets

(56) References Cited

U.S. PATENT DOCUMENTS

2015/0228923 A1* 8/2015 Schicktanz ......... H01L 51/5246
  257/40
2018/0118984 A1* 5/2018 Lee ..................... C08L 33/04
2019/0044089 A1* 2/2019 Helander ............ H01L 51/0046

* cited by examiner

OPTOELECTRONIC PACKAGE WITH A LOW WATER VAPOR TRANSMISSION RATE (WVTR) AND METHOD FOR FABRICATING THE SAME

FIELD OF THE INVENTION

The present invention relates to an optoelectronic component and method for fabricating the same, and more particularly to an optoelectronic package and method for fabricating the same.

BACKGROUND OF THE INVENTION

Conventional illuminating lamps generally employ light emitting diode (LED) dies as light sources. However, water vapor has an adverse effect on the LED die, so that the LED die under extended or long duration contact with water vapor is damaged easily, thereby shortening the lifetime/lifespan of the LED die. Consequently, the present LED dies are always encapsulated to insulate the LED die from external water vapor. Moreover, the LED dies in some of the illuminating lamps, such as the lamp on fishing boat, which works in humid environments need good encapsulations to prevent the invasion of water vapor effectively.

SUMMARY OF THE INVENTION

The invention provides an optoelectronic package, which employs an encapsulation material with a low permeation to insulate an internal light emitting die from external water vapor effectively.

The invention also provides a method for fabricating the optoelectronic package.

According to an embodiment of the present invention, an optoelectronic package includes a carrier, a light emitting die, a cover, and an encapsulation material. The carrier has a carrying plane and a wiring layer on the carrying plane. The light emitting die is mounted on the carrying plane and electrically connected to the wiring layer. The cover is placed on the carrier. A cavity is formed between the cover and the carrier, and the light emitting die is within the cavity. The encapsulation material is formed on the carrier and surrounds the cover. The encapsulation material covers an interface between the cover and the carrier completely.

In an embodiment of the invention, the carrier further has an outer-side surface. The outer-side surface and the encapsulation material both surrounds the carrying plane, and the encapsulation material has an outer surface that is flush with the outer-side surface.

In an embodiment of the invention, the carrier includes a dam. The dam protrudes from the carrying plane and surrounds the light emitting die. The dam is connected to the cover, and the dam, the carrying plane, and the cover defines the cavity.

In an embodiment of the invention, the carrier further includes a board connected to the dam. The board having the carrying plane is integrally formed in one piece with the dam.

In an embodiment of the invention, the cover includes a covering plate and a dam. The dam is connected between the covering plate and the carrier, and the dam surrounds the light emitting die. The covering plate, the dam, and the carrying plane define the cavity.

In an embodiment of the invention, the carrier further has an outer-side surface and a ring-shape groove adjacent to the outer-side surface. The outer-side surface, the ring-shape groove, and the encapsulation material all surround the dam. The encapsulation material fills the ring-shape groove, and has an outer surface flush with the outer-side surface.

In an embodiment of the invention, the covering plate is integrally formed in one piece with the dam.

In an embodiment of the invention, the covering plate is transparent or opaque.

According to yet another embodiment of the present invention, a method for fabricating an optoelectronic package includes: first, providing a package group that includes a package substrate and a plurality of light emitting dies mounted on the package substrate; connecting the package substrate and a plurality of covers separately covering the light emitting dies, in which a plurality of trenches is formed among the covers, and one of the trenches exists between the two adjacent covers; forming an encapsulation material around each of the covers, in which the encapsulation material fills the trenches and completely covers a plurality of interfaces between all of the covers and the package substrate; and dicing the package substrate along the trenches.

In an embodiment of the invention, forming the encapsulation material includes: dispensing encapsulation material on the package substrate; and curing the encapsulation material on the package substrate.

In an embodiment of the invention, the package substrate has a plurality of pre-cuts. The pre-cuts are formed in the bottoms of the trenches respectively, and the encapsulation material also fills the pre-cuts.

The invention uses the encapsulation material with a low water vapor transmission rate (WVTR) to insulate the light emitting die within the optoelectronic package from external water vapor effectively, so that the optoelectronic package of the invention is appropriate for making an illuminating lamp which will work in a humid environment (e.g. lamp of fishing boat) for a long time.

BRIEF DESCRIPTION OF THE DRAWINGS

The present invention will become more readily apparent to those ordinarily skilled in the art after reviewing the following detailed descriptions and accompanying drawings, in which.

DETAILED DESCRIPTION OF PREFERRED EMBODIMENTS

The present invention will now be described more specifically with references to the following embodiments. It is to be noted that the following descriptions of preferred embodiments of this invention are presented herein for purpose of illustration and description only. It is not intended to be exhaustive or to be limited to the precise form disclosed.

Figure 1A:
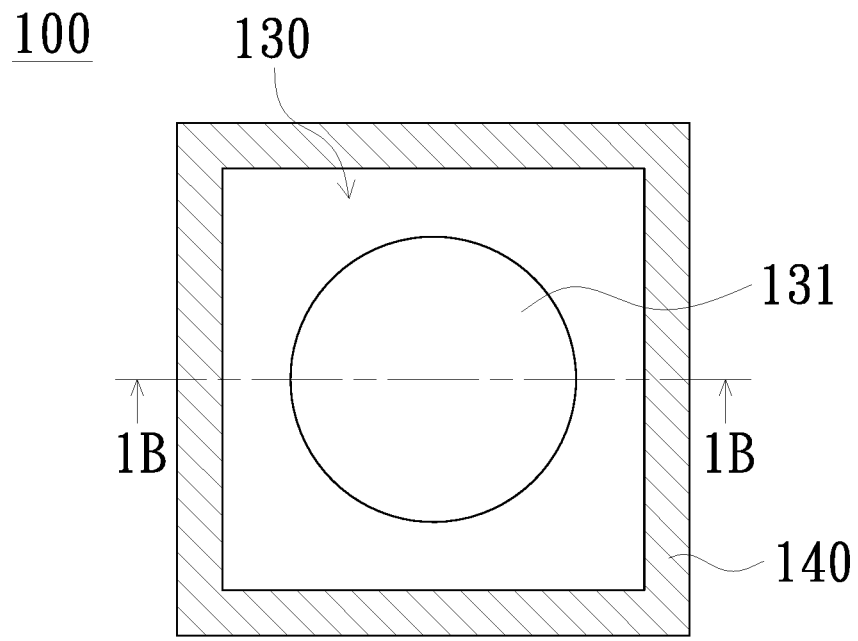
FIG. 1A is a top view of an optoelectronic package according to an embodiment of the present invention.
Figure 1B:
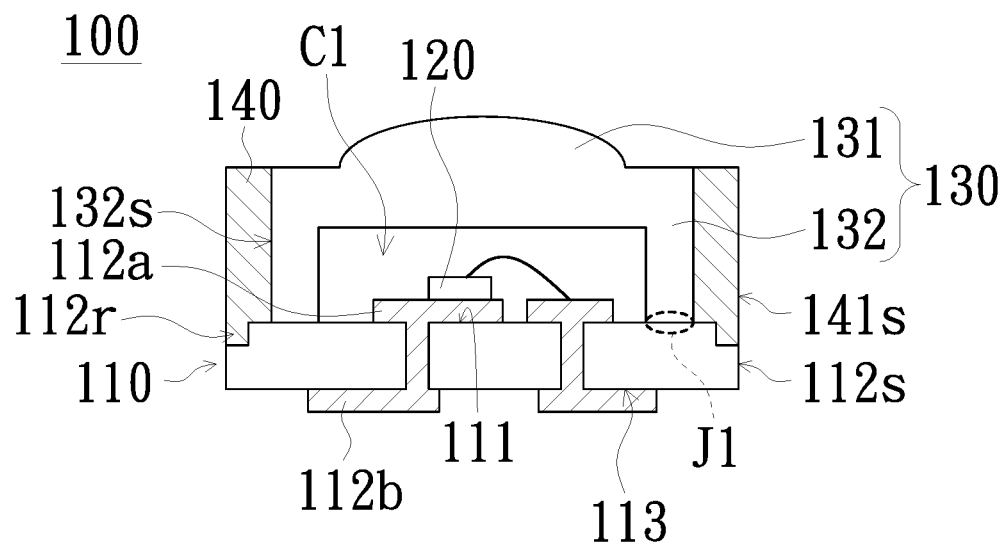
FIG. 1B is a cross-sectional view of the optoelectronic package in FIG. 1A along line 1B-1B.

FIG. 1A is a top view of an optoelectronic package according to an embodiment of the present invention, and FIG. 1B is a cross-sectional view of the optoelectronic package in FIG. 1A taken along line 1B-1B. Referring to FIGS. 1A and 1B, an optoelectronic package 100 includes a carrier 110, which may be a circuit board, such as a printed circuit board (PCB). A dielectric layer (not labeled) of the carrier 110 may be made of prepreg or ceramics. In the embodiment of FIG. 1B, the carrier 110 is a double-sided circuit board, and has two wiring layers 112a and 112b. However, in other embodiment, the carrier 110 also may be a single-sided circuit board or a multilayer circuit board. Thus, the number of the wiring layer that the carrier 110 includes (e.g. the wiring layers 112a and 112b) may be just only one or at least three.

The optoelectronic package 100 further includes a light emitting die 120 mounted on the carrier 110, and the light emitting die 120 is electrically connected to the carrier 110. Specifically, the carrier 110 further has a carrying plane 111 and a back plane 113 opposite to the carrying plane 111. The wiring layer 112a is formed on the carrying plane 111, whereas the wiring layer 112b is formed on the back plane 113. The light emitting die 120 is mounted on the wiring layer 112a on the carrying plane 111 and electrically connected to the wiring layer 112a. In addition, the wiring layer 112b can be electrically connected to and mounted on a substrate, such as a carrier or a circuit board. Taking FIG. 1B as an example, the light emitting die 120 is mounted on the carrying plane 111 by wire-bonding and electrically connected to the wiring layer 112a. However, in other embodiment, the light emitting die 120 may be mounted on the wiring layer 112a and the carrying plane 111 by flip-chip methodology. The light emitting die 120 may be an LED die, which can be used as a visible-light source. Alternatively, the light emitting die 120 also can be used as an invisible-light source, for example, infrared light source or ultraviolet light source.

The optoelectronic package 100 further includes a cover 130 that is placed onto the carrier 110, in which a cavity C1 is formed between the cover 130 and the carrier 110, and the light emitting die 120 is disposed within the cavity C1. In detail, the cover 130 includes a covering plate 131 and a dam 132. The covering plate 131 is connected to the dam 132. As shown in FIG. 1B, the dam 132 extends downwards from the lower side of the covering plate 131, and the dam 132 is in the shape of a ring. Consequently, the dam 132 and the covering plate 131 define a carrying recess (not labeled).

The cover 130 is fixed on the carrying plane 111 and covers the light emitting die 120. The dam 132 is connected between the covering plate 131 and the carrier 110, and the dam 132 surrounds the light emitting die 120. Accordingly, the carrier 110 can encapsulate the carrying recess defined by the dam 132 and the covering plate 131, thereby forming the cavity C1. That is, the covering plate 131, the dam 132, and the carrying plane 111 defines the cavity C1. Additionally, the covering plate 131 may have a function to change the beam angle of light from light emitting die 120. Taking FIG. 1B as an example, the covering plate 131 has a convex surface, so that the covering plate 131 can converge a beam from the light emitting die 120.

In this embodiment, the covering plate 131 and the dam 132 may be integrally-formed in one piece. That is, the covering plate 131 and the dam 132 may both be made of the same material, and neither a boundary nor an interface appears therebetween. For example, both the covering plate 131 and the dam 132 can be made by machining or chemically etching a board, or by the same injection molding, where the board may be a glass plate, and thus, the covering plate 131 may be transparent.

However, in other embodiment, the light emitting die 120 can be used as an infrared light source, and the present technology develops an opaque material that can be penetrated by infrared rays, so that the covering plate 131 that can be penetrated by infrared rays may be opaque. In addition, the covering plate 131 and the dam 132 may not be integrally-formed in one piece. That is, a boundary or an interface may appear and be formed between the covering plate 131 and the dam 132. The covering plate 131 and the dam 132 can be made of different materials respectively. Thus, the covering plate 131 and the dam 132 are not limited to be integrally-formed in one piece.

The optoelectronic package 100 further includes an encapsulation material 140, and the encapsulation material 140 may be a cured adhesive. The main material composing the encapsulation material 140 can be epoxy or silicone. The encapsulation material 140 is formed on the carrier 110 and surrounds the cover 130. The encapsulation material 140 completely covers an interface J1 between the cover 130 and the carrier 110 while the encapsulation material 140 can be in contact with the cover 130 and the carrier 110. The WVTR (water vapor transmission rate) of the encapsulation material 140 is less than 1 $g/m^2/day$, so that the encapsulation material 140 can effectively block external water vapor and prevent the cavity C1 from the invasion of water vapor via penetration at the interface J1, that is, to insulate the light emitting die 120 from water vapor effectively. In addition, a vacuum may be formed in the cavity C1. Alternatively, a filler may be disposed within the cavity C1. The filler may fill the cavity C1 and cover the light emitting die 120, where the filler may be an inert gas or a solid encapsulation. The solid encapsulation of the filler may be transparent and made of resin.

Furthermore, the encapsulation material 140 can have good resistance to corrosion and pass the salt spray test of ASTM B-117 for 300 hours for verification of reliability. Accordingly, the encapsulation material 140 not only has good insulation from water vapor, but also has good resistance to corrosion, thereby effectively blocking the invasion of water vapor, and corrosive substance (such as sea water vapor), so that the optoelectronic package 100 is suitable for working in the humid environment for a long time. That is, the optoelectronic package 100 can be made into not only a common illuminating lamp, such as street lamp and table lamp, but also another illuminating lamp working in the humid environment for a long time, such as lamp of fishing boat.

Moreover, the carrier 110 may further have an outer-side surface 112s and a ring-shape groove 112r. The outer-side surface 112s, the ring-shape groove 112r, and the encapsulation material 140 all surround the carrying plane 111 and the dam 132. The ring-shape groove 112r is adjacent to the outer-side surface 112s. In the embodiment as illustrated in FIG. 1B, the outer-side surface 112s extends downwards from the lower edge of the ring-shape groove 112r. The carrier 110 protrudes from a wall 132s of the dam 132, and the cover 130 does not protrude beyond the outer-side surface 112s of the carrier 110, so that the encapsulation material 140 can be formed on the carrier 110 and surround the dam 132. In addition, the encapsulation material 140 also fills the ring-shape groove 112r, and has an outer surface 141s flush with the outer-side surface 112s of the carrier 110.

Figure 2A:
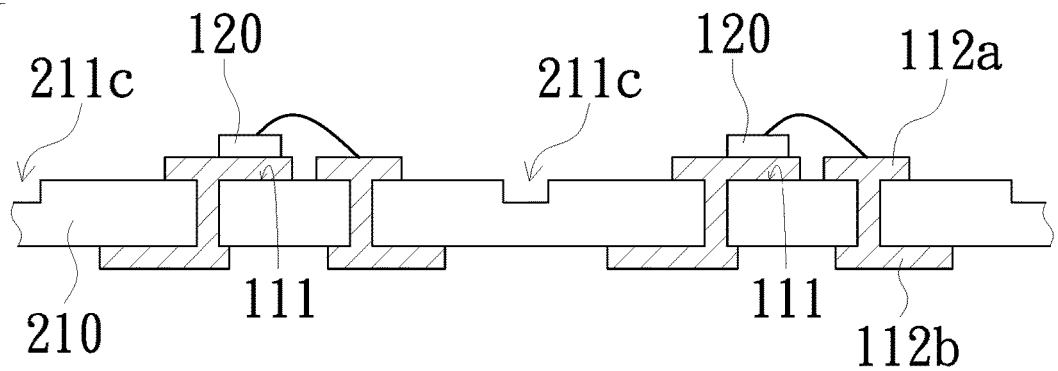
FIGS. 2A to 2E are cross-sectional views of the optoelectronic package throughout a method for fabricating the optoelectronic package in FIG. 1B.

FIGS. 2A to 2E are cross-sectional views of the optoelectronic package showing steps of a method for fabricating the optoelectronic package in FIG. 1B. Referring to FIG. 2A, in a method for fabricating the optoelectronic package 100, first, a package group 200 is provided. The package group 200 includes a package substrate 210 and a plurality of light emitting dies 120 mounted on the package substrate 210.

The package substrate 210 includes a plurality of carriers 110 (not labeled in FIG. 2A), and the carriers 110 are formed by dicing the package substrate 210. In other words, the package substrate 210 is a substrate or a strip that is formed by the connection of the carriers 110, so that the package substrate 210 also has a plurality of carrying planes 111 and includes a plurality of wiring layers 112a and 112b. In addition, the package substrate 210 may have a plurality of pre-cuts 211c, and the pre-cuts 211c surround the light emitting dies 120.

Figure 2B:
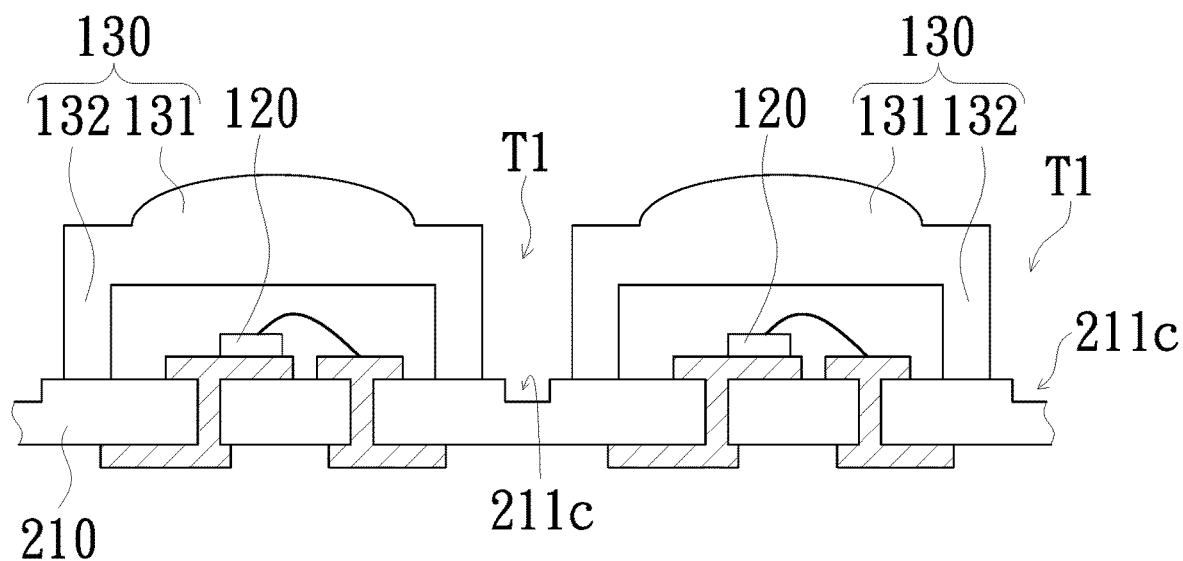
Figure 2C:
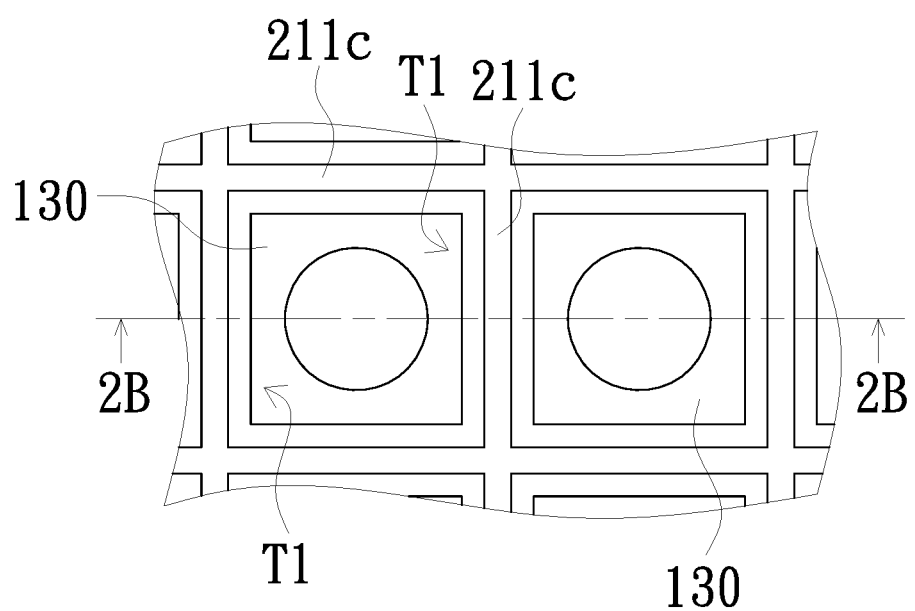

Referring to FIGS. 2B and 2C, FIG. 2C is a top view of FIG. 2B, whereas FIG. 2B is a cross-sectional view along line 2B-2B in FIG. 2C. Afterwards, the covers 130 are connected to the package substrate 210. There are some various methods to connect the cover 130 and the package substrate 210. For example, the cover 130 can be connected to the package substrate 210 by adhering or eutectic bonding. In addition, the adhering and the eutectic bonding may be performed in a vacuum environment or in an inert gas atmosphere, thereby causing a vacuum or the inert gas in the cavity C1. The covers 130 cover the light emitting dies 120 independently and separately. After connecting the covers 130 to the package substrate 210, a plurality of trenches T1 is formed between the separated covers 130, in which one of the trenches T1 exists between two adjacent covers 130. The pre-cuts 211c are formed in the bottoms of the trench T1. In the embodiment as illustrated in FIGS. 2B and 2C, the trenches T1 and the pre-cuts 211c are arranged in a grid and surround the cover 130.

Figure 2D:
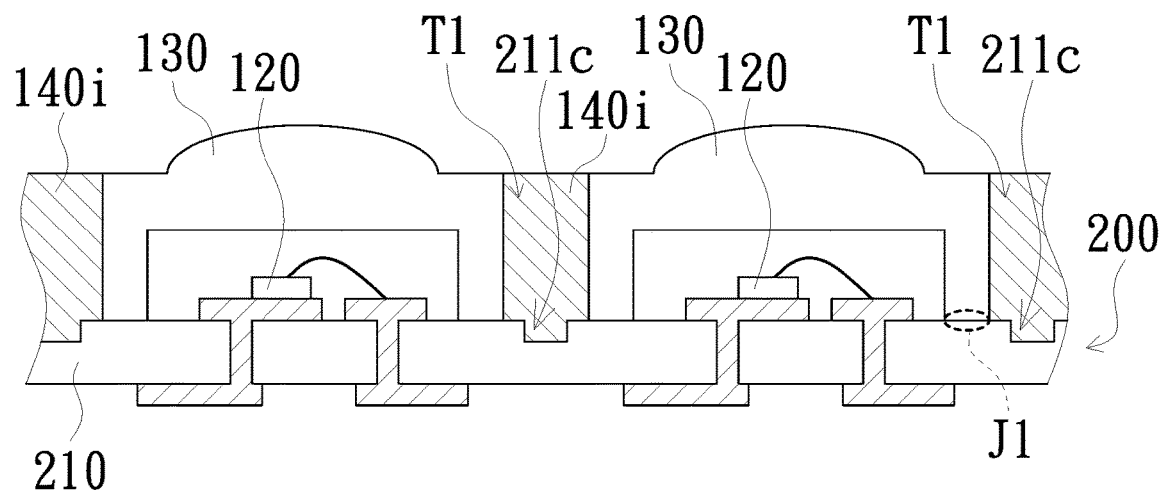

Referring to FIG. 2D, afterwards, an encapsulation material 140i is formed around the covers 130, where the encapsulation material 140i is formed along the trenches T1 and fills the trenches T1 and the pre-cuts 211c. The encapsulation material 140i may be polymer adhesive, which is mainly made of epoxy, for example. Forming the encapsulation material 140i may include the following steps. First, the encapsulation material 140i is dispensed on the package substrate 210. Afterwards, the encapsulation material 140i is cured on the package substrate 210, in which the encapsulation material 140i can be cured by irradiation of ultraviolet rays or heating. Moreover, the encapsulation material 140i can completely cover the interfaces J1 between each of the covers 130 and the package substrate 210.

Figure 2E:
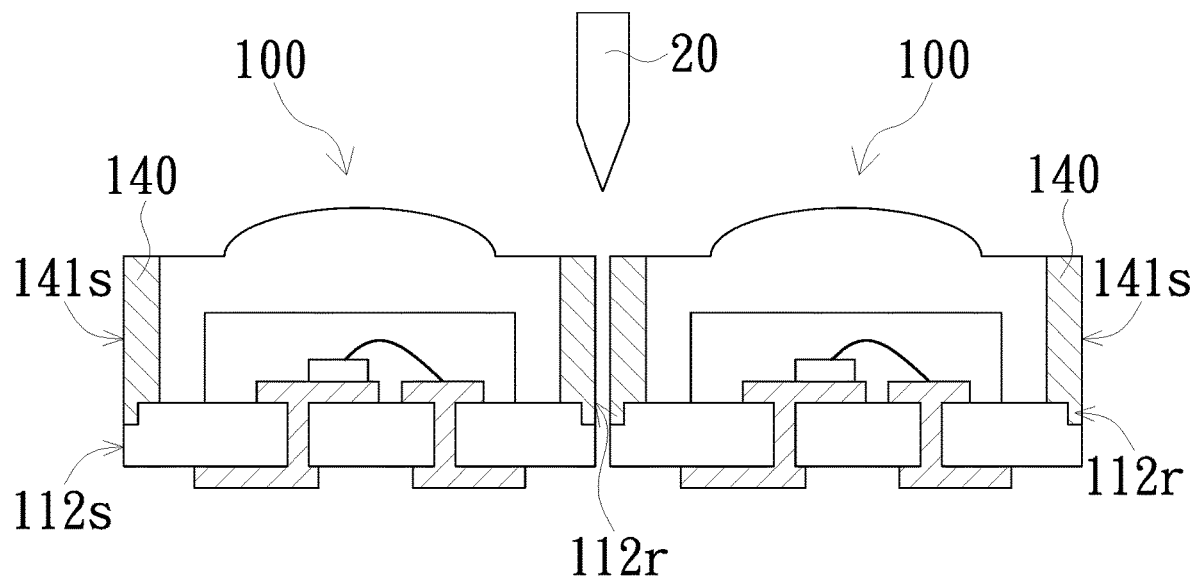

Referring to FIGS. 2D and 2E, afterwards, the package substrate 210 is diced along the trenches T1. For example, the package substrate 210 can be diced by a blade 20 aligning to and along the trenches T1, so as to divide the package group 200 into a plurality of the optoelectronic packages 100. So far, a plurality of the optoelectronic packages 100 is basically produced. Additionally, the blade 20 dices the package substrate 210 along the trenches T1, so the blade 20 cuts apart the encapsulation material 140i to divide the encapsulation material 140i into the encapsulation materials 140 in the optoelectronic packages 100. The outer surface 141s of the encapsulation material 140i and the outer-side surface 112s of the carrier 110 are formed by the cut of the blade 20, so that the outer surface 141s of the encapsulation material 140i is flush with the outer-side surface 112s of the carrier 110. Moreover, the blade 20 also cuts the pre-cuts 211c, and thus, the pre-cuts 211c become a plurality of ring-shape grooves 112r in the optoelectronic packages 100, as shown in FIG. 2E.

Figure 3:
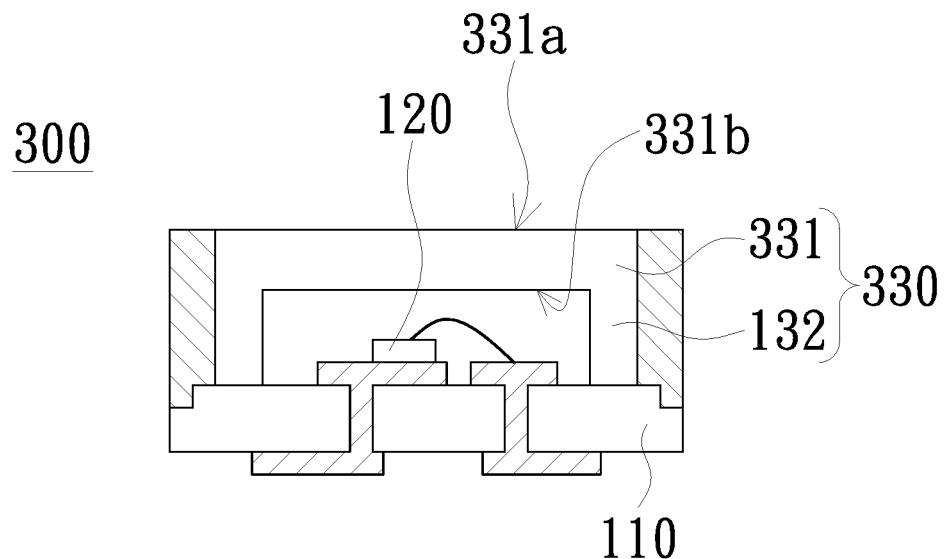
FIG. 3 is a cross-sectional view of an optoelectronic package according to another embodiment of the present invention.

It is noted that the cover 130 includes the covering plate 131 having the convex surface to converge the beam from the light emitting die 120 in the embodiment illustrated in FIG. 1B. However, in other embodiment, the covering plate 131 may not have any convex surface or concave surface, as shown in the optoelectronic package 300 in FIG. 3. Referring to FIG. 3, the optoelectronic package 300 shown in the embodiment of FIG. 3 is similar to the previous optoelectronic package 100, whereas the only one difference between both embodiments is a covering plate 331 included by a cover 330 of the optoelectronic package 300. Specifically, the covering plate 331 has opposite planes 331a and 331b, but does not have any convex surface or concave surface. Thus, the covering plate 331 can not converge or diverge the beam from the light emitting die 120. Furthermore, the material and fabrication method of the cover 330 are the same as those of the covering plate 131, and the covering plate 331 of the cover 330 and the dam 132 can also be integrally formed in one piece, as described in the previous embodiments of FIGS. 1A and 1B.

Figure 4:
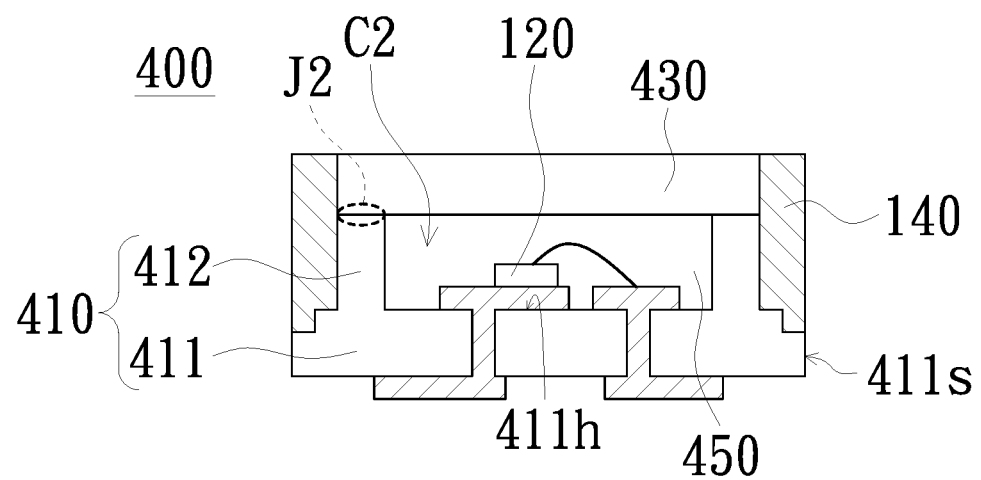
FIG. 4 is a cross-sectional view of an optoelectronic package according to another embodiment of the present invention.

FIG. 4 is a cross-sectional view of an optoelectronic package according to another embodiment of the present invention. Referring to FIG. 4, an optoelectronic package 400 is similar as the optoelectronic package 100 of the previous embodiment. For example, the optoelectronic package 400 also includes a carrier 410, a light emitting die 120, a cover 430, and an encapsulation material 140. The top view of the optoelectronic package 400 in FIG. 4 is very similar as that in FIG. 1A. The means of mounting the light emitting die 120 on the carrier 410 is the same as the means of mounting the light emitting die 120 on the carrier 110 in FIG. 1B, and the encapsulation material 140 also completely covers an interface J2 between the cover 430 and the carrier 410. However, there is a difference between the optoelectronic package 400 and the optoelectronic package 100, for example, the structure of the carrier 410 and the cover 430 are different from that of the carrier 110 and the cover 130, respectively.

The cover 430 is a flat board, such as glass plate, and the material of the cover 430 is the same as that of the covering plate 131, so that the cover 430 also may be transparent or opaque. When the cover 430 is opaque, the cover 430 can be made of the opaque material that is penetrated by infrared rays. The carrier 410 includes a board 411 and a dam 412. The board 411 is connected to the dam 412. The board 411 is substantially the same as the carrier 110 shown in FIG. 1B, and has a carrying plane 411h and an outer-side surface 411s. The outer-side surface 411s and the encapsulation material 140 both surround the carrying plane 411h of the board 411. The carrying plane 411h also provides for mounting the light emitting die 120. The dam 412 protrudes from the carrying plane 411h, and surrounds the light emitting die 120.

In the illustrated embodiment, the board 411 and the dam 412 may be integrally-formed in one piece. That is, the board 411 and the dam 412 can be made of the same material, and neither a boundary nor an interface is formed between the board 411 and the dam 412. For example, the materials of the board 411 and the dam 412 can include ceramics. The board 411 and the dam 412 can be formed via the same sintering process. Additionally, the dam 412 is connected to the cover 430. The dam 412, the carrying plane 411h, and the cover 430 can define the cavity C2, where the light emitting die 120 is within the cavity C2. Moreover, a filler 450 may be disposed within the cavity C2. The filler 450 may fill the cavity C2 and cover the light emitting die 120. The filler 450 may be an inert gas or a solid encapsulation. The solid encapsulation of the filler 450 may be transparent and made of resin. In addition, the filler 450 may also be used in other embodiments. For example, the filler 450 may be formed in the cavity of the optoelectronic package 300 shown in FIG. 3.

Figure 5A:
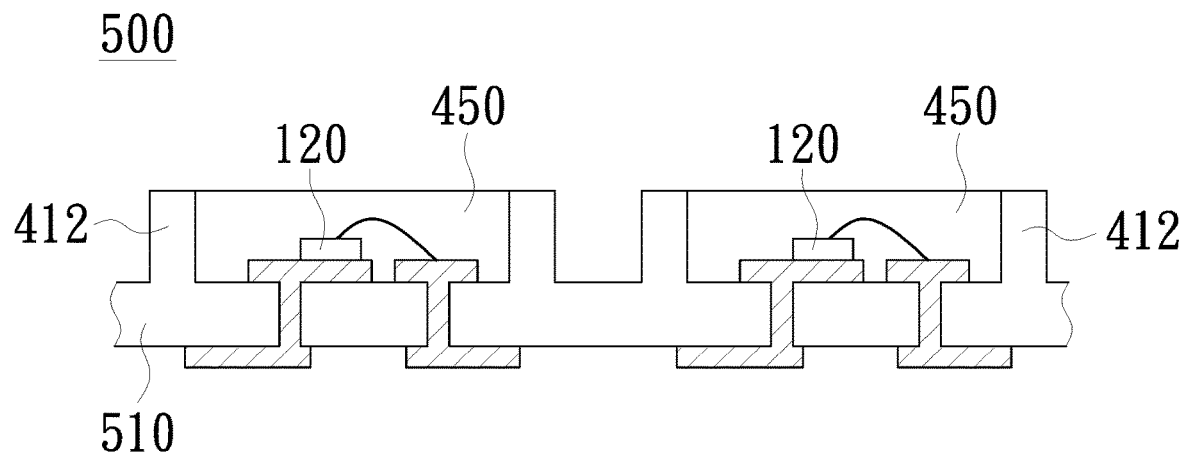
FIGS. 5A to 5C are cross-sectional views of the optoelectronic package throughout a method for fabricating the optoelectronic package in FIG. 4.
Figure 5B:
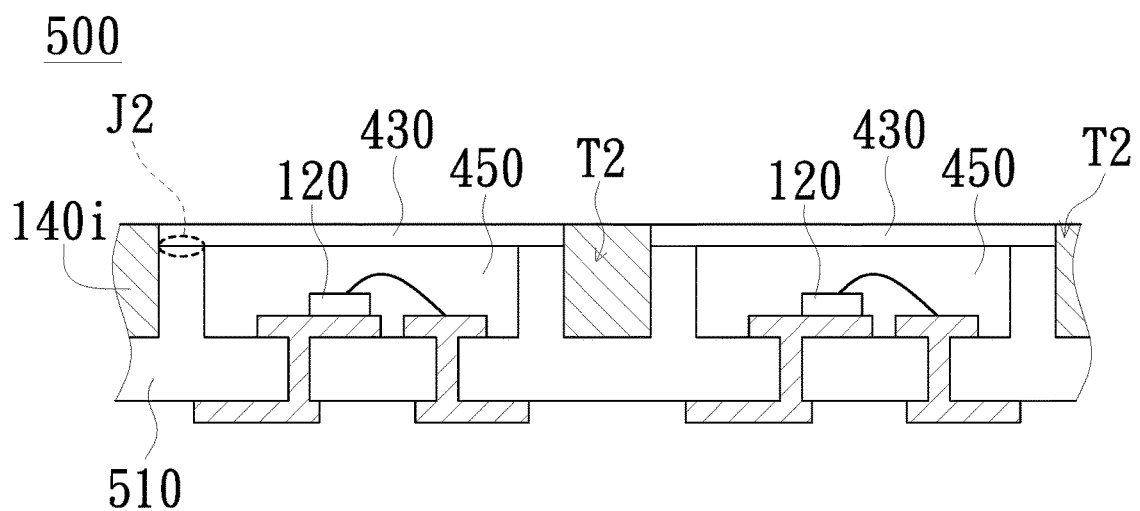
Figure 5C:
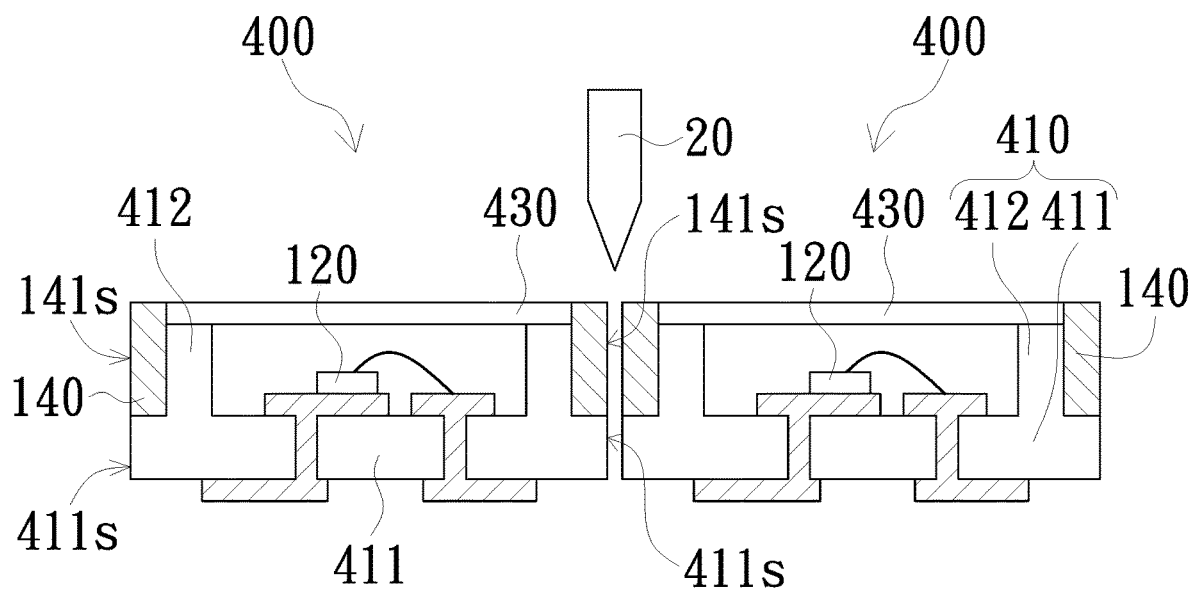

FIGS. 5A to 5C are cross-sectional views of the optoelectronic package during sequential steps of a method for fabricating the optoelectronic package in FIG. 4. Referring to FIG. 5A, the methods for fabricating the optoelectronic packages 400 and 100 are similar. In the method for fabricating the optoelectronic package 400, first, a package group 500 including a package substrate 510, a plurality of fillers 450, and a plurality of light emitting dies 120 mounted on the package substrate 510 is provided. The fillers 450 cover the light emitting dies 120 respectively. The package substrate 510 includes a plurality of carriers 410 (not labeled in FIG. 5A), and the carriers 410 are connected to each other to form a substrate or a strip. Therefore, the carriers 410 can be formed by dicing the package substrate 510. Unlike the package substrate 210 in FIG. 2A, the package substrate 510 includes a plurality of carriers 410. Hence, the package substrate 510 includes a plurality of the protruding dams 412, and the package substrate 510 does not have any pre-cut 211c.

Referring to FIG. 5B, afterwards, the covers 430 are connected to the package substrate 510. The covers 430 are connected to the package substrate 510 by adhering or eutectic bonding. After the covers 430 are connected to the package substrate 510, a plurality of trench T2 is formed among the covers 430, and one of the trenches T2 is formed between two adjacent covers 430. The trenches T2 are arranged in a grid. Afterwards, the encapsulation material 140i is formed around the covers 430 and fills the trenches T2, in which the encapsulation material 140i covers the interfaces J2 between all the covers 430 and the package substrate 510 completely. The formation of the encapsulation material 140i is described in the previous embodiment herein and is not repeated again.

Referring to FIGS. 5B and 5C, afterwards, the package substrate 510 is diced along the trenches T2. For example, the package substrate 510 is diced by the blade 20 aligning to and along the trenches T2, so as to divide the package group 500 into a plurality of optoelectronic packages 400, and to divide the encapsulation material 140i into a plurality of encapsulation materials 140. So far, a plurality of the optoelectronic packages 400 in basic structure is completed. Additionally, the outer surface 141s of the encapsulation material 140i and the outer-side surface 411s of the board 411 are formed by the cut of the blade 20, so the outer surface 141s of the encapsulation material 140i is flush with the outer-side surface 411s of the board 411.

Figure 6:
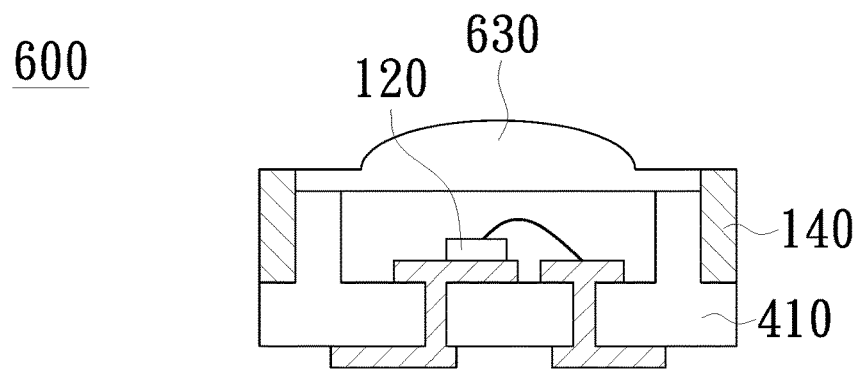
FIG. 6 is a cross-sectional view of an optoelectronic package according to yet another embodiment of the present invention.

It is noted that the cover 430 is a flat board in the embodiment illustrated in FIG. 4, but the cover 430 in other embodiment can have a convex surface or a concave surface, and change the beam angle of light from the light emitting die 120, as shown in the optoelectronic package 600 in FIG. 6. Referring to FIG. 6, the optoelectronic package 600 shown in FIG. 6 is similar as the (previous embodiment) optoelectronic package 400, and the only one difference between the two embodiments is that the cover 630 of the optoelectronic package 600 has a convex surface, so that the cover 630 has a function of converging the beam of light from the light emitting die 120.

To sum up, the encapsulation material which cover the interface between the cover and the carrier completely has good insulation from water vapor, and WVTR of the encapsulation material is less than 1 g/m²/day, for example. Thus, external water vapor is difficult to invade to reach the light emitting die disposed within the cavity through the interface between the cover and the carrier. Therefore, the encapsulation material as described in the present invention can effectively protect the light emitting die from water vapor damage, so that the optoelectronic package can be appropriately made into an illuminating lamp working in a humid environment (e.g. lamp of fishing boat) to last for a long time.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An optoelectronic package, comprising:
   a carrier, having a carrying plane and a wiring layer on the carrying plane;
   a light emitting die, mounted on the carrying plane and electrically connected to the wiring layer;
   a cover, connected to the carrier, wherein a cavity is formed between the cover and the carrier, and the light emitting die is within the cavity; and
   an encapsulation material, formed on the carrier and surrounding the cover, wherein the encapsulation material completely covers an interface between the cover and the carrier, and a water vapor transmission rate (WVTR) of the encapsulation material is less than 1 g/m²/day;
   wherein the carrier further has an outer-side surface and a ring-shape groove adjacent to the outer-side surface, wherein the encapsulation material fills the ring-shape groove and has an outer surface flush with the outer-side surface of the carrier.

2. The optoelectronic package of claim 1, wherein the carrier further has an outer-side surface, and both the outer-side surface and the encapsulation material surround the carrying plane, wherein the encapsulation material has an outer surface that is flush with the outer-side surface of the carrier.

3. The optoelectronic package of claim 1, wherein the carrier comprises a dam protruding from the carrying plane, and the dam surrounds the light emitting die and is connected to the cover, wherein the dam, the carrying plane, and the cover define the cavity.

4. The optoelectronic package of claim 3, wherein the carrier further comprises a board connected to the dam, and the board has the carrying plane and is integrally formed in one piece with the dam.

5. The optoelectronic package of claim 1, wherein the cover comprises:
   a covering plate; and
   a dam, connected between the covering plate and the carrier, and surrounding the light emitting die, wherein the covering plate, the dam of the cover, and the carrying plane define the cavity.

6. The optoelectronic package of claim 5, wherein the outer-side surface, the ring-shape groove, and the encapsulation material all surround the dam.

7. The optoelectronic package of claim 5, wherein the covering plate and the dam of the cover are integrally formed in one piece.

8. The optoelectronic package of claim 5, wherein the covering plate is transparent.

9. The optoelectronic package of claim 5, wherein the covering plate is opaque.

10. The optoelectronic package of claim 1, further comprising a filler disposed within the cavity.

11. The optoelectronic package of claim 10, wherein the filler is an inert gas or a solid encapsulation.

12. A method for fabricating an optoelectronic package, comprising:
   providing a package group comprising a package substrate and a plurality of light emitting dies mounted on the package substrate;
   connecting a plurality of covers to the package substrate, wherein the covers separately cover the plurality of light emitting dies, and a plurality of trenches is formed between adjacent covers;
   forming an encapsulation material around each of the covers, wherein the encapsulation material fills the plurality of trenches and completely covers a plurality of interfaces formed between the package substrate and each of the covers, wherein a water vapor transmission rate (WVTR) of the encapsulation material is less than 1 $g/m^2/day$; and
   dicing the package substrate along the trenches.

13. The method of claim 12, wherein forming the encapsulation material comprises:
   dispensing the encapsulation material on the package substrate; and
   curing the encapsulation material on the package substrate.

14. The method of claim 12, wherein the package substrate has a plurality of pre-cuts formed in the bottoms of the plurality of trenches respectively, and the encapsulation material also fills the pre-cuts.

\* \* \* \* \*